(12) United States Patent
Ahn et al.

(10) Patent No.: US 7,754,618 B2
(45) Date of Patent: Jul. 13, 2010

(54) METHOD OF FORMING AN APPARATUS HAVING A DIELECTRIC CONTAINING CERIUM OXIDE AND ALUMINUM OXIDE

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 104 days.

(21) Appl. No.: 12/117,361

(22) Filed: May 8, 2008

(65) Prior Publication Data
US 2008/0248618 A1    Oct. 9, 2008

Related U.S. Application Data

(62) Division of application No. 11/055,380, filed on Feb. 10, 2005, now Pat. No. 7,374,964.

(51) Int. Cl.
*H01L 21/302* (2006.01)
*H01L 21/461* (2006.01)

(52) U.S. Cl. .............. 438/742; 438/197; 438/238; 438/722; 257/E21.17; 257/E21.006; 257/E21.278; 257/E29.255

(58) Field of Classification Search ............ 438/197, 438/199, 238, 381, 680, 688, 722, 723, 742, 438/756, 770, 775; 257/E21.17, 278, E29.255, 257/6
See application file for complete search history.

(56) References Cited

U.S. PATENT DOCUMENTS

| | | | |
|---|---|---|---|
| 4,058,430 | A | 11/1977 | Suntola et al. |
| 4,645,622 | A | 2/1987 | Kock |
| 4,693,211 | A | 9/1987 | Ogami et al. |
| 4,870,923 | A | 10/1989 | Sugimoto |
| 5,198,029 | A | 3/1993 | Dutta et al. |
| 5,223,001 | A | 6/1993 | Saeki |

(Continued)

FOREIGN PATENT DOCUMENTS

EP    0540993 A1    5/1993

(Continued)

OTHER PUBLICATIONS

Alers, G. B., et al., "Intermixing at the tantalum oxide/silicon interface in gate dielectric structures", *Applied Physics Letters*, 73(11), (Sep. 14, 1998), 1517-1519.

(Continued)

*Primary Examiner*—David Nhu
(74) *Attorney, Agent, or Firm*—Schwegman, Lundberg & Woessner, P.A.

(57) ABSTRACT

A dielectric layer including cerium oxide and aluminum oxide acting as a single dielectric layer, and a method of fabricating such a dielectric layer, produces a reliable structure with a high dielectric constant (high-k) for use in a variety of electronic devices. Such a dielectric layer including cerium oxide and aluminum oxide may be used as the gate insulator of a MOSFET, as a capacitor dielectric in a DRAM, as a tunnel gate insulator in flash memory, or as a dielectric in an NROM device, among others, because the high dielectric constant (high-k) of the film provides the functionality of a much thinner silicon dioxide film.

25 Claims, 5 Drawing Sheets

U.S. PATENT DOCUMENTS

| | | | |
|---|---|---|---|
| 5,274,249 A | 12/1993 | Xi et al. | |
| 5,572,052 A | 11/1996 | Kashihara et al. | |
| 5,608,670 A | 3/1997 | Akaogi et al. | |
| 5,674,563 A | 10/1997 | Tarui et al. | |
| 5,674,574 A | 10/1997 | Atwell et al. | |
| 5,712,180 A | 1/1998 | Guterman et al. | |
| 5,827,571 A | 10/1998 | Lee et al. | |
| 5,840,897 A | 11/1998 | Kirlin et al. | |
| 5,879,459 A | 3/1999 | Gadgil et al. | |
| 5,916,365 A | 6/1999 | Sherman | |
| 5,923,056 A | 7/1999 | Lee et al. | |
| 5,981,350 A | 11/1999 | Geusic et al. | |
| 6,020,024 A | 2/2000 | Maiti et al. | |
| 6,025,225 A | 2/2000 | Forbes et al. | |
| 6,060,755 A | 5/2000 | Ma et al. | |
| 6,090,636 A | 7/2000 | Geusic et al. | |
| 6,110,529 A | 8/2000 | Gardiner et al. | |
| 6,134,175 A | 10/2000 | Forbes et al. | |
| 6,144,584 A | 11/2000 | Kunori et al. | |
| 6,150,188 A | 11/2000 | Geusic et al. | |
| 6,174,809 B1 | 1/2001 | Kang et al. | |
| 6,191,448 B1 | 2/2001 | Forbes et al. | |
| 6,198,168 B1 | 3/2001 | Geusic et al. | |
| 6,203,613 B1 | 3/2001 | Gates et al. | |
| 6,289,842 B1 | 9/2001 | Tompa | |
| 6,297,539 B1 | 10/2001 | Ma et al. | |
| 6,317,357 B1 | 11/2001 | Forbes | |
| 6,342,445 B1 | 1/2002 | Marsh | |
| 6,352,591 B1 | 3/2002 | Yieh et al. | |
| 6,381,168 B2 | 4/2002 | Forbes | |
| 6,399,979 B1 | 6/2002 | Noble et al. | |
| 6,418,050 B2 | 7/2002 | Forbes | |
| 6,420,230 B1 | 7/2002 | Derderian et al. | |
| 6,423,613 B1 | 7/2002 | Geusic | |
| 6,429,065 B2 | 8/2002 | Forbes | |
| 6,434,041 B2 | 8/2002 | Forbes et al. | |
| 6,444,592 B1 | 9/2002 | Ballantine et al. | |
| 6,445,023 B1 | 9/2002 | Vaartstra et al. | |
| 6,451,695 B2 | 9/2002 | Sneh | |
| 6,452,119 B1 * | 9/2002 | Gessner | 200/19.18 |
| 6,452,229 B1 | 9/2002 | Krivokapic | |
| 6,454,912 B1 | 9/2002 | Ahn et al. | |
| 6,461,436 B1 | 10/2002 | Campbell et al. | |
| 6,465,298 B2 | 10/2002 | Forbes et al. | |
| 6,476,434 B1 | 11/2002 | Noble et al. | |
| 6,486,027 B1 | 11/2002 | Noble et al. | |
| 6,486,703 B2 | 11/2002 | Noble et al. | |
| 6,492,233 B2 | 12/2002 | Forbes et al. | |
| 6,495,436 B2 | 12/2002 | Ahn et al. | |
| 6,498,065 B1 | 12/2002 | Forbes et al. | |
| 6,504,214 B1 * | 1/2003 | Yu et al. | 257/347 |
| 6,506,666 B2 | 1/2003 | Marsh | |
| 6,514,828 B2 | 2/2003 | Ahn et al. | |
| 6,515,510 B2 | 2/2003 | Noble et al. | |
| 6,518,615 B1 | 2/2003 | Geusic et al. | |
| 6,526,191 B1 | 2/2003 | Geusic et al. | |
| 6,534,420 B2 | 3/2003 | Ahn et al. | |
| 6,538,330 B1 | 3/2003 | Forbes | |
| 6,540,214 B2 | 4/2003 | Barber | |
| 6,541,280 B2 | 4/2003 | Kaushik et al. | |
| 6,541,353 B1 | 4/2003 | Sandhu et al. | |
| 6,542,229 B1 | 4/2003 | Kalal et al. | |
| 6,596,636 B2 | 7/2003 | Sandhu et al. | |
| 6,597,037 B1 | 7/2003 | Forbes et al. | |
| 6,608,378 B2 | 8/2003 | Ahn et al. | |
| 6,613,695 B2 | 9/2003 | Pomarede et al. | |
| 6,630,383 B1 | 10/2003 | Ibok et al. | |
| 6,630,713 B2 | 10/2003 | Geusic | |
| 6,632,279 B1 | 10/2003 | Ritala et al. | |
| 6,642,573 B1 | 11/2003 | Halliyal et al. | |
| 6,660,660 B2 | 12/2003 | Haukka et al. | |
| 6,661,058 B2 | 12/2003 | Ahn et al. | |
| 6,674,138 B1 * | 1/2004 | Halliyal et al. | 257/411 |
| 6,689,660 B1 | 2/2004 | Noble et al. | |
| 6,709,978 B2 | 3/2004 | Geusic et al. | |
| 6,713,671 B1 | 3/2004 | Wang et al. | |
| 6,723,577 B1 | 4/2004 | Geusic et al. | |
| 6,746,930 B2 | 6/2004 | Yang et al. | |
| 6,754,108 B2 | 6/2004 | Forbes | |
| 6,756,298 B2 | 6/2004 | Ahn et al. | |
| 6,760,257 B2 | 7/2004 | Huang et al. | |
| 6,764,901 B2 | 7/2004 | Noble | |
| 6,767,795 B2 | 7/2004 | Ahn et al. | |
| 6,770,923 B2 | 8/2004 | Nguyen et al. | |
| 6,777,715 B1 | 8/2004 | Geusic et al. | |
| 6,778,441 B2 | 8/2004 | Forbes et al. | |
| 6,784,101 B1 | 8/2004 | Yu et al. | |
| 6,787,370 B2 | 9/2004 | Forbes | |
| 6,787,413 B2 | 9/2004 | Ahn | |
| 6,790,791 B2 | 9/2004 | Ahn et al. | |
| 6,804,136 B2 | 10/2004 | Forbes | |
| 6,812,100 B2 | 11/2004 | Ahn et al. | |
| 6,812,513 B2 | 11/2004 | Geusic et al. | |
| 6,812,516 B2 | 11/2004 | Noble, Jr. et al. | |
| 6,818,937 B2 | 11/2004 | Noble et al. | |
| 6,821,862 B2 | 11/2004 | Cho | |
| 6,844,203 B2 | 1/2005 | Ahn et al. | |
| 6,858,120 B2 | 2/2005 | Ahn et al. | |
| 6,858,444 B2 | 2/2005 | Ahn et al. | |
| 6,884,739 B2 | 4/2005 | Ahn et al. | |
| 6,888,739 B2 | 5/2005 | Forbes | |
| 6,893,984 B2 | 5/2005 | Ahn et al. | |
| 6,914,800 B2 | 7/2005 | Ahn et al. | |
| 6,919,266 B2 | 7/2005 | Ahn et al. | |
| 6,921,702 B2 | 7/2005 | Ahn et al. | |
| 6,929,830 B2 | 8/2005 | Tei et al. | |
| 6,952,032 B2 | 10/2005 | Forbes et al. | |
| 6,953,730 B2 | 10/2005 | Ahn et al. | |
| 6,979,855 B2 | 12/2005 | Ahn et al. | |
| 6,995,437 B1 | 2/2006 | Kinoshita et al. | |
| 7,018,868 B1 | 3/2006 | Yang et al. | |
| 7,019,351 B2 | 3/2006 | Eppich et al. | |
| 7,026,694 B2 | 4/2006 | Ahn et al. | |
| 7,045,430 B2 | 5/2006 | Ahn et al. | |
| 7,049,192 B2 | 5/2006 | Ahn et al. | |
| 7,064,058 B2 | 6/2006 | Ahn et al. | |
| 7,068,544 B2 | 6/2006 | Forbes et al. | |
| 7,081,421 B2 | 7/2006 | Ahn et al. | |
| 7,084,078 B2 | 8/2006 | Ahn et al. | |
| 7,112,841 B2 | 9/2006 | Eldridge et al. | |
| 7,122,415 B2 | 10/2006 | Jang et al. | |
| 7,129,553 B2 | 10/2006 | Ahn et al. | |
| 7,135,369 B2 | 11/2006 | Ahn et al. | |
| 7,135,421 B2 | 11/2006 | Ahn et al. | |
| 7,135,734 B2 | 11/2006 | Eldridge et al. | |
| 7,160,577 B2 | 1/2007 | Ahn et al. | |
| 7,195,999 B2 | 3/2007 | Forbes et al. | |
| 7,205,218 B2 | 4/2007 | Ahn et al. | |
| 7,211,492 B2 | 5/2007 | Forbes et al. | |
| 7,214,994 B2 | 5/2007 | Forbes et al. | |
| 7,221,017 B2 | 5/2007 | Forbes et al. | |
| 7,221,586 B2 | 5/2007 | Forbes et al. | |
| 7,235,501 B2 | 6/2007 | Ahn et al. | |
| 7,235,854 B2 | 6/2007 | Ahn et al. | |
| 7,312,494 B2 | 12/2007 | Ahn et al. | |
| 7,323,423 B2 | 1/2008 | Brask et al. | |
| 7,374,964 B2 * | 5/2008 | Ahn et al. | 438/104 |
| 7,388,246 B2 | 6/2008 | Ahn et al. | |
| 7,405,454 B2 | 7/2008 | Ahn et al. | |
| 7,410,910 B2 | 8/2008 | Ahn et al. | |
| 7,411,237 B2 | 8/2008 | Ahn et al. | |
| 7,432,548 B2 | 10/2008 | Forbes et al. | |
| 7,433,237 B2 | 10/2008 | Forbes et al. | |
| 7,439,194 B2 | 10/2008 | Ahn et al. | |

| Patent/Publication | Date | Inventors |
|---|---|---|
| 7,485,544 B2 | 2/2009 | Forbes et al. |
| 7,489,545 B2 | 2/2009 | Forbes et al. |
| 7,494,873 B2 | 2/2009 | Forbes et al. |
| 7,494,939 B2 | 2/2009 | Ahn et al. |
| 7,498,230 B2 | 3/2009 | Ahn et al. |
| 7,508,648 B2 | 3/2009 | Ahn et al. |
| 7,511,326 B2 | 3/2009 | Ahn et al. |
| 7,517,783 B2 | 4/2009 | Ahn et al. |
| 7,518,246 B2 | 4/2009 | Ahn et al. |
| 7,531,869 B2 | 5/2009 | Ahn et al. |
| 7,544,604 B2 | 6/2009 | Forbes et al. |
| 7,554,161 B2 | 6/2009 | Ahn et al. |
| 7,563,730 B2 | 7/2009 | Forbes et al. |
| 7,582,549 B2 | 9/2009 | Ahn et al. |
| 7,583,534 B2 | 9/2009 | Forbes et al. |
| 7,605,030 B2 | 10/2009 | Forbes et al. |
| 7,615,438 B2 | 11/2009 | Ahn et al. |
| 7,625,794 B2 | 12/2009 | Ahn et al. |
| 2001/0002280 A1 | 5/2001 | Sneh |
| 2002/0020429 A1 | 2/2002 | Selbrede |
| 2002/0100418 A1 | 8/2002 | Sandhu et al. |
| 2002/0102818 A1 | 8/2002 | Sandhu et al. |
| 2002/0110991 A1 | 8/2002 | Li |
| 2002/0111001 A1 | 8/2002 | Ahn |
| 2002/0122885 A1 | 9/2002 | Ahn |
| 2002/0146916 A1 | 10/2002 | Irino et al. |
| 2002/0155688 A1 | 10/2002 | Ahn |
| 2002/0155689 A1 | 10/2002 | Ahn |
| 2002/0192974 A1 | 12/2002 | Ahn et al. |
| 2002/0192975 A1 | 12/2002 | Ahn |
| 2002/0192979 A1 | 12/2002 | Ahn |
| 2002/0195056 A1 | 12/2002 | Sandhu et al. |
| 2003/0001212 A1 | 1/2003 | Hu et al. |
| 2003/0003635 A1 | 1/2003 | Paranjpe et al. |
| 2003/0003702 A1 | 1/2003 | Ahn |
| 2003/0017717 A1 | 1/2003 | Ahn |
| 2003/0020429 A1 | 1/2003 | Masaki et al. |
| 2003/0032270 A1 | 2/2003 | Snyder et al. |
| 2003/0043637 A1 | 3/2003 | Forbes et al. |
| 2003/0045082 A1 | 3/2003 | Eldridge et al. |
| 2003/0048666 A1 | 3/2003 | Eldridge et al. |
| 2003/0119246 A1 | 6/2003 | Ahn |
| 2003/0119291 A1 | 6/2003 | Ahn et al. |
| 2003/0157764 A1 | 8/2003 | Ahn et al. |
| 2003/0170389 A1 | 9/2003 | Sandhu |
| 2003/0181039 A1 | 9/2003 | Sandhu et al. |
| 2003/0207032 A1 | 11/2003 | Ahn et al. |
| 2003/0207540 A1 | 11/2003 | Ahn et al. |
| 2003/0216038 A1 | 11/2003 | Madhukar et al. |
| 2003/0227033 A1 | 12/2003 | Ahn et al. |
| 2003/0228747 A1 | 12/2003 | Ahn et al. |
| 2003/0235961 A1 | 12/2003 | Metzner et al. |
| 2004/0004245 A1 | 1/2004 | Forbes et al. |
| 2004/0004247 A1 | 1/2004 | Forbes |
| 2004/0007171 A1 | 1/2004 | Ritala et al. |
| 2004/0023461 A1 | 2/2004 | Ahn et al. |
| 2004/0038554 A1 | 2/2004 | Ahn |
| 2004/0040494 A1 | 3/2004 | Vaartstra et al. |
| 2004/0043541 A1 | 3/2004 | Ahn et al. |
| 2004/0043569 A1 | 3/2004 | Ahn et al. |
| 2004/0110348 A1 | 6/2004 | Ahn et al. |
| 2004/0110391 A1 | 6/2004 | Ahn et al. |
| 2004/0135186 A1 | 7/2004 | Yamamoto |
| 2004/0144980 A1 | 7/2004 | Ahn et al. |
| 2004/0156578 A1 | 8/2004 | Geusic et al. |
| 2004/0159863 A1 | 8/2004 | Eldridge et al. |
| 2004/0164357 A1 | 8/2004 | Ahn et al. |
| 2004/0166628 A1 | 8/2004 | Park et al. |
| 2004/0175882 A1 | 9/2004 | Ahn et al. |
| 2004/0183108 A1 | 9/2004 | Ahn |
| 2004/0214399 A1 | 10/2004 | Ahn et al. |
| 2004/0217410 A1 | 11/2004 | Meng et al. |
| 2004/0219783 A1 | 11/2004 | Ahn et al. |
| 2004/0222476 A1 | 11/2004 | Ahn et al. |
| 2004/0233010 A1 | 11/2004 | Akram et al. |
| 2004/0262700 A1 | 12/2004 | Ahn et al. |
| 2005/0009370 A1 | 1/2005 | Ahn |
| 2005/0020017 A1 | 1/2005 | Ahn et al. |
| 2005/0023574 A1 | 2/2005 | Forbes et al. |
| 2005/0023594 A1 | 2/2005 | Ahn et al. |
| 2005/0023595 A1 | 2/2005 | Forbes et al. |
| 2005/0023602 A1 | 2/2005 | Forbes et al. |
| 2005/0023603 A1 | 2/2005 | Eldridge et al. |
| 2005/0023624 A1 | 2/2005 | Ahn et al. |
| 2005/0023625 A1 | 2/2005 | Ahn et al. |
| 2005/0023626 A1 | 2/2005 | Ahn et al. |
| 2005/0024092 A1 | 2/2005 | Forbes |
| 2005/0026349 A1 | 2/2005 | Forbes et al. |
| 2005/0026360 A1 | 2/2005 | Geusic et al. |
| 2005/0029547 A1 | 2/2005 | Ahn et al. |
| 2005/0029604 A1 | 2/2005 | Ahn et al. |
| 2005/0029605 A1 | 2/2005 | Ahn et al. |
| 2005/0030825 A1 | 2/2005 | Ahn |
| 2005/0032292 A1 | 2/2005 | Ahn et al. |
| 2005/0032342 A1 | 2/2005 | Forbes et al. |
| 2005/0037563 A1 | 2/2005 | Ahn |
| 2005/0051828 A1 | 3/2005 | Park et al. |
| 2005/0054165 A1 | 3/2005 | Ahn et al. |
| 2005/0138262 A1 | 6/2005 | Forbes |
| 2005/0140462 A1 | 6/2005 | Akram et al. |
| 2005/0145957 A1 | 7/2005 | Ahn et al. |
| 2005/0145959 A1 | 7/2005 | Forbes |
| 2005/0164521 A1 | 7/2005 | Ahn et al. |
| 2005/0260357 A1 | 11/2005 | Olsen et al. |
| 2006/0000412 A1 | 1/2006 | Ahn et al. |
| 2006/0019033 A1 | 1/2006 | Muthukrishnan et al. |
| 2006/0022252 A1 | 2/2006 | Doh et al. |
| 2006/0023513 A1 | 2/2006 | Forbes et al. |
| 2006/0024975 A1 | 2/2006 | Ahn et al. |
| 2006/0027882 A1 | 2/2006 | Mokhlesi |
| 2006/0028867 A1 | 2/2006 | Forbes et al. |
| 2006/0028869 A1 | 2/2006 | Forbes et al. |
| 2006/0043492 A1 | 3/2006 | Ahn et al. |
| 2006/0043504 A1 | 3/2006 | Ahn et al. |
| 2006/0046505 A1 | 3/2006 | Ahn et al. |
| 2006/0046522 A1 | 3/2006 | Ahn et al. |
| 2006/0081895 A1 | 4/2006 | Lee et al. |
| 2006/0125030 A1 | 6/2006 | Ahn et al. |
| 2006/0128168 A1 | 6/2006 | Ahn et al. |
| 2006/0148180 A1 | 7/2006 | Ahn et al. |
| 2006/0176645 A1 | 8/2006 | Ahn et al. |
| 2006/0189154 A1 | 8/2006 | Ahn et al. |
| 2006/0244082 A1 | 11/2006 | Ahn et al. |
| 2006/0245984 A1 | 11/2006 | Kulkarni et al. |
| 2006/0255470 A1 | 11/2006 | Ahn et al. |
| 2006/0261397 A1 | 11/2006 | Ahn et al. |
| 2007/0007560 A1 | 1/2007 | Forbes et al. |
| 2007/0010061 A1 | 1/2007 | Forbes et al. |
| 2007/0010929 A1 | 1/2007 | Takeda et al. |
| 2007/0020835 A1 | 1/2007 | Ahn et al. |
| 2007/0027882 A1 | 2/2007 | Kulkarni |
| 2007/0048926 A1 | 3/2007 | Ahn |
| 2007/0049051 A1 | 3/2007 | Ahn et al. |
| 2007/0049054 A1 | 3/2007 | Ahn et al. |
| 2007/0090440 A1 | 4/2007 | Ahn et al. |
| 2007/0099366 A1 | 5/2007 | Ahn et al. |
| 2007/0111544 A1 | 5/2007 | Ahn |
| 2007/0158765 A1 | 7/2007 | Ahn et al. |
| 2007/0178643 A1 | 8/2007 | Forbes et al. |
| 2008/0029790 A1 | 2/2008 | Ahn et al. |
| 2008/0032424 A1 | 2/2008 | Ahn et al. |
| 2008/0032465 A1 | 2/2008 | Ahn et al. |
| 2008/0057659 A1 | 3/2008 | Forbes |
| 2008/0057690 A1 | 3/2008 | Forbes |
| 2008/0087890 A1 | 4/2008 | Ahn et al. |
| 2008/0099829 A1 | 5/2008 | Forbes et al. |

| | | | |
|---|---|---|---|
| 2008/0121962 | A1 | 5/2008 | Forbes et al. |
| 2008/0193791 | A1 | 8/2008 | Ahn et al. |
| 2008/0194094 | A1 | 8/2008 | Ahn et al. |
| 2009/0002025 | A1 | 1/2009 | Forbes et al. |
| 2009/0004801 | A1 | 1/2009 | Ahn et al. |
| 2009/0032910 | A1 | 2/2009 | Ahn et al. |
| 2009/0108363 | A1 | 4/2009 | Forbes et al. |
| 2009/0173979 | A1 | 7/2009 | Ahn et al. |
| 2009/0218612 | A1 | 9/2009 | Forbes et al. |
| 2009/0236650 | A1 | 9/2009 | Forbes et al. |
| 2009/0294924 | A1 | 12/2009 | Forbes et al. |

FOREIGN PATENT DOCUMENTS

| | | |
|---|---|---|
| EP | 1096042 A1 | 5/2001 |
| EP | 1124262 A2 | 8/2001 |
| EP | 1324376 A1 | 7/2003 |
| JP | 2002-033320 | 1/2002 |
| WO | WO-0231875 A2 | 4/2002 |
| WO | WO-2006026716 A1 | 3/2006 |

OTHER PUBLICATIONS

Ami, Takaaki, et al., "MOCVD growth of (100)-oriented $CeO_2$ thin films on hydrogen-terminated Si(100) substrates", *Materials Science and Engineering B54*, (1998), 84-91.

Anwander, Reiner, et al., "Volatile Donor-Functionalized Alkoxy Derivatives of Lutetium and Their Structural Characterization", *Inorganic Chemistry*, 36(16), (Jul. 30, 1997), 3545-3552.

Aspinall, Helen C., et al., "Growth of Praseodymium Oxide and Praseodymium Silicate Thin Films by Liquid Injection MOCVD", *Chemical Vapor Deposition*, 10(2), (Mar. 2004), 83-89.

Atanassova, E., et al., "Breakdown Fields and Conduction Mechanisms in thin $Ta_2O_5$ Layers on Si for high density DRAMs", *Microelectronics Reliability*, 42, (2002), 157-173.

Chin, A., et al., "High Quality $La_2O_3$ and $Al_2O_3$ Gate Dielectrics with Equivalent Oxide Thickness 5-10Å", *Digest of Technical Papers. 2000 Symposium on VLSI Technology*, 2000, Honolulu, (Jun. 13-15, 2000), 16-17.

Colombo, D., et al., "Anhydrous Metal Nitrates as Volatile Single Source Precursors for the CVD of Metal Oxide Films", *Communications, Department of EE, U of M, Mpls, MN*, (Jul. 7, 1998), 3 pages.

Conley, J. F., "Atomic Layer Deposition of Hafnium oxide Using Anhydrous Hafnium Nitrate", *Electrochemical and Solid-State Letters*, 5(5), (May 2002), C57-C59.

Copel, M., et al., "Formation of a stratified lanthanum silicate dielectric by reaction with Si(001)", *Applied Physics Letters*, 78(11), (Mar. 12, 2001), 1607-1609.

Copel, M., et al., "Structure and stability of ultrathin zirconium oxide layers on Si(001)", *Applied Physics Letters*, 76(4), (Jan. 2000), 436-438.

De Almeida, R.M.C., et al., "Reaction-diffusion in high-k dielectrics on Si", *Surface Science Reports*, 49, (2003), 1-114.

Dimoulas, A., et al., "Structural and electrical quality of the high-k dielectric Y2O3 on Si (001): Dependence on growth parameters", *Journal of Applied Physics*, 92(1), (Jul. 1, 2002), 426-431.

Duenas, et al., "Interface Quality of High-Pressure Reactive Sputterd and Atomic Layer Deposited Titanium oxide Thin Films on Silicon", *IEEE Transaction, Spanish Conference on Electronic Devices*, (Feb. 2-4, 2005), 49-52.

Guha, S, et al., "Atomic beam deposition of lanthanum-and yttrium-based oxide thin films for gate dielectrics", *Applied Physics Letters*, 77, (2000), 2710-2712.

Guha, S., et al., "High temperature stability of $Al_2O_3$ dielectrics on Si: Interfacial metal diffusion and mobility degradation", *Applied Physics Letters*, vol. 81, No. 16, (Oct. 14, 2002), 2956-2958.

Gusev, E P, "Ultrathin High-K Dielectrics Grown by Atomic Layer Deposition: A Comparative Study of $ZrO_2$, $HfO_2$, $Y_2O_3$ and $Al_2O_3$", *Electrochemical Society Proceedings* vol. 2001-9, (2001), 189-195.

Gusev, E. P., et al., "High-resolution depth profiling in ultrathin $Al_2O_3$ films on Si", *Applied Physics Letters*, 76(2), (Jan. 10, 2000), 176-178.

Herrmann, Wolfgang A., et al., "Volatile Metal Alkoxides according to the Concept of Donor Functionalization", *Angewandte Chemie International Edition in English*, 34(20), (1995), 2187-2206.

Ho, M.-Y., et al., "Suppressed crystallization of Hf-based gate dielectrics by controlled addition of $Al_2O_3$ using atomic layer deposition", *Applied Physics Letters*, vol. 81, No. 22, (Nov. 2002), 4218-4220.

Huang, C. H., et al., "$La_2O_3/Si_{0.3}/Ge_{0.7}$ p-MOSFETs with high hole mobility and good device characteristics", *IEEE Electron Device Letters*, 23(12), (Dec. 2002), 710-712.

Inoue, T., et al., "Epitaxial growth of $CeO_2$ layers on silicon", *Applied Physics Letters*, 56(14), (Apr. 2, 1990), 1332-1333.

Inoue, T., et al., "Low temperature epitaxial growth of $CeO_2(110)$ layers on Si(100) using electron beam assisted evaporation", *Thin Solid Films*, vol. 343-344, (Apr. 1999), 594-597.

Iwai, H., et al., "Advanced gate dielectric materials for sub-100 nm CMOS", *International Electron Devices Meeting*, 2002. IEDM '02. Digest., (Dec. 8-11, 2002), 625-628.

Iwamoto, K., "Advanced Layer-By-Layer Deposition and Annealing Process For High-Quality High-K Dielectrics Formation", *Electrochemical Society Proceedings* vol. 2003 (14), (2003), 265-272.

Jeon, Sanghun, et al., "Excellent electrical characteristics of lanthanide (Pr, Nd, Sm, Gd, and Dy) oxide and lanthanide-doped oxide for MOS gate dielectric applications", *Electron Devices Meeting, 2001. IEDM Technical Digest. International*, (2001), 471-474.

Jun, Jin Hyung, et al., "Effect of Structural Properties on Electrical Properties of Lanthanum Oxide Thin Film as a Gate Dielectric", *Japanese Journal of Applied Physics*, 42, Part 1, No. 6A, (Jun. 15, 2003), 3519-3522.

Jun, Jin Hyung, et al., "Properties of Lanthanum Aluminate Thin Film Deposited by MOCVD", *Electrochemical and Solid-State Letters*, 6(11), (2003), F37-F39.

Jun, Jino, et al., "Study on the precursors for $La_2O_3$ thin films deposited on silicon substrate", *Journal of Materials Science Letters 21*, (2002), 1847-1849.

Kang, J. F., et al., "Epitaxial Growth of $C_2O_2(1\ 0\ 0)$ Films on Si (1 0 0) Substrates by Dual Ion Beams Reactive Sputtering", *Solid State Communications*, 108(4), (1998), 225-227.

Kim, C. T., "Application of $Al_2O_3$ Grown by Atomic Layer Deposition to DRAM and FeRAM", *12th International Symposium in Integrated Ferroelectrics*, (Mar. 2000), p. 316.

Kingon, Angus I, et al., "Alternative dielectrics to Silicon dioxide for Memory and Logic Devices", *Nature*, vol. 406, (Aug. 31, 2000), 1032-1038.

Ko, Myoung-Gyun, et al., "High density plasma enhanced atomic layer deposition of lanthanum oxide for high-k gate oxide material", *207th Meeting of the Electrochemical Society*, (May 2005), 1 page.

Krug, C., et al., "Atomic Transport and Chemical Stability during Annealing of Ultrathin $Al_2O_3$ Films on Si", *Physical Review Letters*, 85(19), (Nov. 6, 2000), 4120-4123.

Kukli, Kaupo, "Dielectric Properties of Zirconium Oxide Grown by Atomic Layer Deposition from Iodide Precursor", *Journal of The Electrochemical Society*, 148(12), (2001), F227-F232.

Kukli, Kaupo, "Tailoring the dielectric properties of $HfO_2$-$Ta_2O_3$ nanolaminates", *Appl. Phys. Lett.*, 68, (1996), 3737-3739.

Kuse, Ronald, et al., "Effect of precursor concentration in atomic layer deposition of Al2O3", *Journal of Applied Physics*, 94(10), (Nov. 15, 2003), 6411-6416.

Kwo, J., et al., "High E gate dielectrics $Gd_2O_3$ and $Y_2O_3$ for silicon", *Applied Physics Letters*, 77(1), (Jul. 3, 2000), 130-132.

Lee, A E, et al., "Epitaxially grown sputtered $LaAlO_3$ films", *Applied Physics Letters*, 57(19), (Nov. 1990), 2019-2021.

Lee, Byoung Hun, et al., "Thermal stability and electrical characteristics of ultrathin hafnium oxide gate dielectric reoxidized with rapid thermal annealing", *Applied Physics Letters*, 76(14), (Apr. 3, 2000), 1926-1928.

Lee, Yong Ju, et al., "Atomic Layer Deposition of Aluminum Thin Films Using an Alternating Supply of Trimethylaluminum and a Hydrogen Plasma", *Electrochecmical and Solid-State Letters*, 5(10), (2002), C91-C93.

Leskela, M., "ALD precursor chemistry: Evolution and future challenges", *J. Phys. IV France*, 9, (1999), 837-852.

Liu, J. P., et al., "Epitaxial growth of $Pr_2O_3$ on Si(111) and the observation of a hexagonal to cubic phase transition during postgrowth N2 annealing", *Applied Physics Letters*, 79(5), (Jul. 30, 2001), 671-673.

Lo Nigro, Raffaella, et al., "MOCVD Growth of $Pr_2O_3$ High-K Gate Dielectric for Silicon: Synthesis and Structural Investigation", *The Electrochemical Society, Inc., 203rd Meeting—Paris, France*, (Apr. 27-May 2, 2003), 915-922.

Lu, Weixing, et al., "Preparation and characterization of $Y_2O_3$-doped $CeO_2$ ultrathin film made from Langmuir-Blodgett films", *Thin Solid Films*, 418, (2002), 175-181.

Lu, X. B., et al., "Investigation of high-quality ultra-thin $LaAlO_3$ films as high-k gate dielectrics", *Journal of Physics D: Applied Physics*, 36, (Dec. 7, 2003), 3047-3050.

Lu, Xu-Bing, et al., "Structure and dielectric prioperties of amorphous $LaAlO_3$ and $LaAlOxNy$ films as alternative gate dielectric materials", *Journal of Applied Physics*, vol. 94, No. 2, (Jul. 15, 2003), 1229-1234.

Maria, J. P., et al., "High temperature stability in lanthanum and zirconia-based gate dielectrics", *Journal of Applied Physics*, 90(7), (Oct. 1, 2001), 3476-3482.

Michaelson, Herbert B., "The work function of the elements and its periodicity", *Journal of Applied Physics*, 48(11), (Nov. 1977), 4729-4733.

Morais, J., et al., "Composition, atomic transport, and chemical stability of $ZrAlxOy$ ultrathin films deposited on Si(001)", *Applied Physics Letters*, 79(13), (Sep. 24, 2001), 1998-2000.

Nahm, Choon-Woo, "Microstructure and electrical properties of Y2O3-doped ZnO-Pr6O1-based varistor ceramics", *Materials Letters*, 57(7), (Jan. 2003), 1317-1321.

Nakajima, Anri, "Atomic-layer deposition of ZrO/sub 2/ with a Si nitride barrier layer", *Applied Physics Letters*, 81(15), (Oct. 2002), 2824-2826.

Nieminen, Minna, et al., "Growth of gallium oxide thin films from gallium acetylacetonate by atomic layer deposition", *J. Mater. Chem.*, 6(1), (1996), 27-31.

Osten, H J, et al., "High-k Gate Dielectrics with Ultra-low Leakage Current Based on Praseodymium Oxide", *Technical Digest of IEDM*, (2000), 653-656.

Osten, H. J., et al., "Band gap and band discontinuities at crystalline $Pr_2O_3$ Si(001) heterojunctions", *Applied Physics Letters*, 80(2), (Jan. 14, 2002), 297-299.

Osten, H. J., et al., "Growth of crystalline praseodymium oxide on silicon", *Journal of Crystal Growth*, 235(1-4), (Feb. 2002), 229-234.

Paivasaari, Jani, et al., "Cerium dioxide buffer layers at low temperature by atomic layer deposition", *Journal of Materials Chemistry*, 12, (2002), 1828-1832.

Pan, M., et al., "Pure and doped $CeO_2$ thin films prepared by MOCVD process", *Thin Solid Films 324*, (1998), 89-93.

Park, Dae-Gyu, et al., "Boron penetration and thermal instability of p+ polycrystalline-Si/$ZrO_2$/$SiO_2$ n-Si metal-oxide-semiconductor structure", *Journal of Applied Physics*, 91(1), (Jan. 1, 2002), 65-68.

Park, Dae-Gyu, et al., "Characteristics of $Al_2O_3$ Gate Dielectrics Prepared by Atomic Layer Deposition for Giga Scale CMOS DRAM Devices", *2000 Symposium on VLSI Technology Digest of Technical Papers*, (2000), 46-47.

Perkins, Charles M, et al., "Electrical and materials properties of $ZrO_2$ gate dielectrics grown by atomic layer chemical vapor deposition", *Applied Physics Letters*, 78(16), (Apr. 2001), 2357-2359.

Rahtu, Antti, "Atomic Layer Deposition of Zirconium Titanium Oxide from Titanium Isopropoxide and Zirconium Chloride", *Chemistry of Materials*, 13(5), (May 2001), 1528-1532.

Ritala, M., "Atomic layer deposition of oxide thin films with metal alkoxides as oxygen sources", *Science*, 288(5464), (Apr. 14, 2000), 319-321.

Robertson, J., "Band offsets of wide-band-gap oxides and implications for future electronic devices", *Journal of Vacuum Science & Technology B (Microelectronics and Nanometer Structures)*, 18(3), (May-Jun. 2000), 1785-1791.

Rotondaro, A L, et al., "Advanced CMOS Transistors with a Novel HfSiON Gate Dielectric", *Symposium on VLSI Technology Digest of Technical Papers*, (2002), 148-149.

Roy, P. K., et al., "Stacked high-E gate dielectric for gigascale integration of metal-oxide-semiconductor technologies", *Applied Physics Letters*, vol. 72, No. 22, (Jun. 1998), 2835-2837.

Shimizu, Takashi, et al., "Electrical Properties of Ruthenium/Metalorganic Chemical Vapor Deposited La-Oxide/Si Field Effect Transistors", *Jpn. J. Appl. Phys.*, vol. 42, Part 2, No. 11A, (2003), L1315-L1317.

Shin, Chang Ho, "Fabrication and Characterization of MFISFET Using $Al_2O_3$ Insulating Layer for Non-volatile Memory", *12th International Symposium in Integrated Ferroelectrics*, (Mar. 2000), 9 pages.

Sneh, Ofer, "Thin film atomic layer deposition equipment for semiconductor processing", *Thin Solid Films*, 402(1-2), Preparation and Characterization, Elsevier Sequoia, NL, vol. 402, No. 1-2, (2002), 248-261.

Sneh, Ofer, "Thin film atomic layer deposition equipment for semiconductor processing", *Thin Solid Films*, 402(1-2), (2002), 248-261.

Suntola, T., "Atomic Layer Epitaxy", *Handbook of Crystal Growth, 3; Thin Films of Epitaxy, Part B: Growth Mechanics and Dynamics*, Amsterdam, (1994), 601-663.

Suntola, Tuomo, "Atomic layer epitaxy", *Thin Solid Films*, 216(1), (Aug. 28, 1992), 84-89.

Tewg, J.Y., "Electrical and Physical Characterization of Zirconium-Doped Tantalum Oxide Films", *Electrochemical Society Proceedings*, vol. 2002-28, (2002), 75-81.

Van Dover, R B, "Amorphous lanthanide-doped TiOx dielectric films", *Applied Physics Letters*, 74(20), (May 1999), 3041-3043.

Van Dover, R. B., "Amorphous lanthanide-doped TiOx dielectric films", *Applied Physics Letters*, 74(20), (May 17, 1999), 3041-3043.

Wang, S. J., et al., "Epitaxial Y-stabilized $ZrO_2$ films on silicon: Dynamic growth process and interface structure", *Applied Physics Letters*, vol. 80, No. 14, (Apr. 8, 2002), 2541-2543.

Wang, S. J., et al., "Microstructural studies on a high quality $YBa_2Cu_3O_7$-α/YSZ/Si multilayer prepared by pulsed-laser deposition", *Supercond. Sci. Technol. 13*, (2000), 362-367.

Wilk, G D, et al., "Hafnium and zirconium silicates for advanced gate dielectrics", *Journal of Applied Physics*, 87(1), (Jan. 2000), 484-492.

Wilk, G. D., "High-K gate dielectrics: Current status and materials properties considerations", *Journal of Applied Physics*, 89(10), (May 2001), 5243-5275.

Williams, Paul A., et al., "Novel Mononuclear Alkoxide Precursors for the MOCVD of $ZrO_2$ and $HfO_2$ Thin Films", *Chemical Vapor Deposition*, 8(4), (Jul. 2002), 163-170.

Xiang, Wenfeng, et al., "Characteristics of $LaAlO_3$/Si(100) deposited under various oxygen pressures", *Journal of Applied Physics*, vol. 20, No. 1, (Jan. 1, 2003), 533-536.

Xiao, et al., "Deposition of hard mental nitride-like coatings in an electro cyclotron resonance discharge", *Elsevier*, (Sep. 13, 2003), 389-393.

Yamada, Hirotoshi, et al., "MOCVD of High-Dielectric-Constant Lanthanum Oxide Thin Films", *Journal of The Electrochemical Society*, 150(8), (Aug. 2003), G429-G435.

Yan, L., et al., "Amorphous $(CeO2)0.67(Al_2O_3)0.33$ high-k gate dielectric thin films on silicon", *Semiconductor Science and Technology*, 18, (2003), L39-L41.

Yu, H. Y., et al., "Energy gap and band alignment for $(HfO_2)x(Al_2O_3)1$-x on (100) Si", *Applied Physics Letters*, vol. 81, No. 2, (Jul. 8, 2002), 376-378.

Yu, H. Y., et al., "Thermal stability of $(HfO_2)x(Al_2O_3)1$-x on Si", *Applied Physics Letters*, vol. 81, No. 19, (Nov. 4, 2002), 3618-3620.

Yu, Xiongfei, et al., "High Mobility and Excellent Electrical Stability of MOSFETs Using a Novel HfTaO Gate Dielectric", *2004 Symposium on VLSI Technology Digest of Technical Papers*, (Jun. 15-17, 2004), 110-111.

Zhang, H, et al., "High permitivity thin film nanolaminates", *Journal of Applied Physics*, 87(4), (Feb. 2000), 1921-1924.

Zhang, H., "Atomic layer deposition of high dielectric constant nanolaminates", *Journal of The Electrochemical Society*, 148(4), (Apr. 2001), F63-F66.

Zhong, H., et al., "Characterization of $RuO_2$ electrodes on Zr silicate and $ZrO_2$ dielectrics", *Applied Physics Letters*, vol. 78, No. 8, (Feb. 19, 2001), 1134-1136.

Zhong, Huicai, et al., "Electrical Properties of Ru and $RuO_2$ Gate Electrodes for Si-PMOSFET with $ZrO_2$ and Zr-Silicate Dielectrics", *Journal of Electronic Materials*, 30(12), (Dec. 2001), 1493-1498.

* cited by examiner

METHOD OF FORMING AN APPARATUS HAVING A DIELECTRIC CONTAINING CERIUM OXIDE AND ALUMINUM OXIDE

RELATED APPLICATION(S)

This application is a divisional of U.S. application Ser. No. 11/055,380, filed Feb. 10, 2005, now issued as U.S. Pat. No. 7,374,964, which is incorporated herein by reference in its entirety.

TECHNICAL FIELD

This application relates generally to semiconductor devices and device fabrication and, more particularly, to dielectric layers and their method of fabrication.

BACKGROUND

The semiconductor device industry has a market driven need to reduce the size of devices such as transistors in order to obtain lower power consumption and higher performance. To reduce transistor size, the thickness of the silicon dioxide, $SiO_2$, gate dielectric is reduced in proportion to the shrinkage of the gate length. For example, a metal-oxide-semiconductor field effect transistor (MOSFET) would use a 1.5 nm thick $SiO_2$ gate dielectric for a gate length of 70 nm. A goal is to fabricate increasingly smaller and more reliable integrated circuits (ICs) for use in products such as processor chips, mobile telephones, and memory devices such as dynamic random access memories (DRAMs).

Currently, the semiconductor industry relies on the ability to reduce or scale the dimensions of its basic devices, such as the silicon based MOSFET. This device scaling includes scaling the gate dielectric, which has been fabricated using silicon dioxide. A thermally grown amorphous $SiO_2$ layer provides an electrically and thermodynamically stable material, where the interface of the $SiO_2$ layer with underlying silicon provides a high quality interface as well as superior electrical isolation properties. However, increased scaling and other requirements in microelectronic devices have created the need to use other dielectric materials as gate dielectrics, in particular dielectrics with higher dielectric constants (k) to replace the conventional use of various combinations of $SiO_2$, $Si_3N_4$ and SiON. Practical higher dielectric constant (k) materials have the properties of high permittivity, thermal stability, high film and surface quality and smoothness, low hysteresis characteristics, low leakage current density, and long term reliability. High k films may be amorphous metal oxide unary materials such as $Al_2O_3$, $CeO_2$, $HfO_2$ and $ZrO_2$, which have a single component, or binary systems such as $(Y_2O_3)_x(ZrO_2)_{1-x}$, $LaAlO_3$, and $(HfO_2)_x(Al_2O_3)_{1-x}$, which have two components, and so on. High k films may be single layers, or formed of multiple layers of different materials that act as a composite material. There is a need in the industry to find a method of forming high k films that possess the above noted features and are practical for use in manufacturing integrated circuits (ICs).

DETAILED DESCRIPTION

Figure 1:
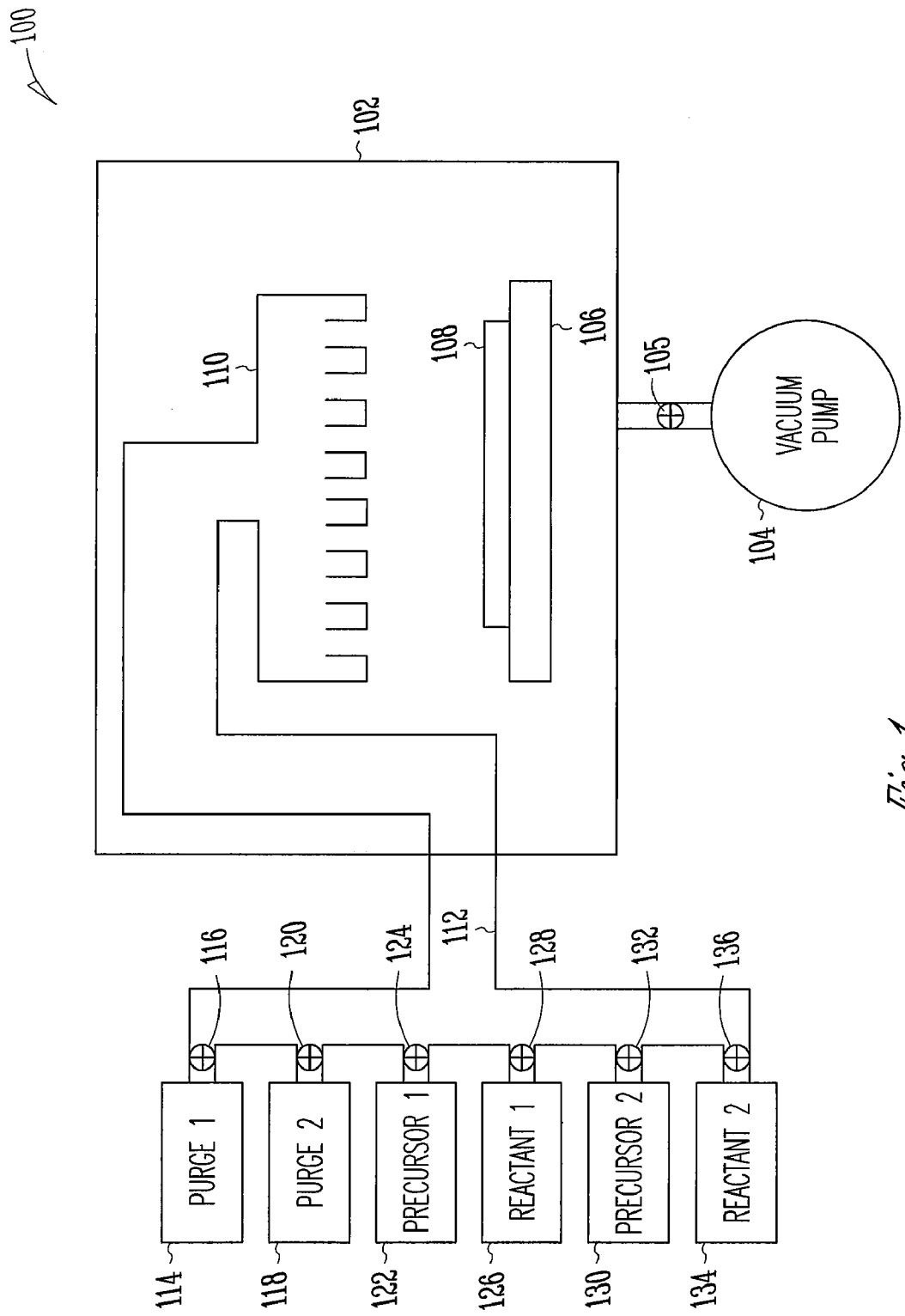
FIG. 1 depicts an atomic layer deposition system for fabricating a single dielectric layer formed as a nanolaminate layered sequence of cerium oxide ($CeO_2$) and aluminum oxide ($Al_2O_3$), according to various embodiments of the present invention.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments are not necessarily mutually exclusive, as some embodiments can be combined with one or more other embodiments to form new embodiments.

The terms wafer and substrate used in the following description include any structure having an exposed surface with which to form an integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to generally include n-type and p-type semiconductors and the term insulator or dielectric is defined to include any material that is less electrically conductive than the materials referred to as conductors or as semiconductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

A gate dielectric in a transistor has both a physical gate dielectric thickness and an equivalent oxide thickness ($t_{eq}$). The equivalent oxide thickness quantifies the electrical properties, such as capacitance, of the gate dielectric in terms of a representative physical thickness. $t_{eq}$ is defined as the thickness of a theoretical $SiO_2$ layer that would be required to have the same capacitance density as a given dielectric, ignoring leakage current and reliability considerations.

A $SiO_2$ layer of thickness, t, deposited on a Si surface as a gate dielectric will have a $t_{eq}$ larger than its thickness, t. This $t_{eq}$ results from the capacitance in the surface channel on which the $SiO_2$ is deposited due to the formation of a depletion/inversion region. This depletion/inversion region can result in $t_{eq}$ being from 3 to 6 Angstroms (Å) larger than the $SiO_2$ thickness, t. Thus, with the semiconductor industry driving to someday scale the gate dielectric equivalent oxide thickness to under 10 Å, the physical thickness requirement for a $SiO_2$ layer used for a gate dielectric would be need to be approximately 4 to 7 Å.

Additional requirements on a $SiO_2$ layer would depend on the gate electrode used in conjunction with the $SiO_2$ gate dielectric. Using a conventional polysilicon gate would result in an additional increase in $t_{eq}$ for the $SiO_2$ layer. This additional thickness could be eliminated by using a metal gate electrode, though metal gates are not currently used in typical complementary metal-oxide-semiconductor field effect transistor (CMOS) technology. Thus, future devices may require a physical $SiO_2$ gate dielectric layer of about 5 Å or less. Such a small thickness requirement for a $SiO_2$ oxide layer creates additional problems.

Silicon dioxide is used as a gate dielectric, in part, due to its electrical isolation properties in a $SiO_2$—Si based structure. This electrical isolation is due to the relatively large band gap of $SiO_2$ (8.9 eV) making it a good insulator from electrical conduction. Signification reductions in its band gap would eliminate $SiO_2$ as a material for a gate dielectric. As the thickness of a $SiO_2$ layer decreases, the number of atomic layers, or monolayers of the material in the thickness decreases. At a certain thickness, the number of monolayers will be sufficiently small that the $SiO_2$ layer will not have a complete arrangement of atoms as in a thicker or bulk layer. As a result of incomplete formation relative to a bulk structure, a thin $SiO_2$ layer of only one or two monolayers will not form a full band gap. The lack of a full band gap in a $SiO_2$ gate dielectric may cause an effective short between an underlying conductive silicon channel and an overlying polysilicon gate. This undesirable property sets a limit on the physical thickness to which a $SiO_2$ layer can be scaled. The minimum thickness due to this monolayer effect is thought to be about 7-8 Å. Therefore, for future devices to have a $t_{eq}$ less than about 10 Å, other dielectrics than $SiO_2$ need to be considered for use as a gate dielectric.

For a typical dielectric layer used as a gate dielectric, the capacitance is determined as in a parallel plate capacitance: $C=\kappa \epsilon_0 A/t$, where $\kappa$ is the dielectric constant, $\epsilon_0$ is the permittivity of free space, A is the area of the capacitor, and t is the thickness of the dielectric. The thickness, t, of a material is related to its $t_{eq}$ for a given capacitance, with $SiO_2$ having a dielectric constant $\kappa_{ox}=3.9$, as $$t=(\kappa/\kappa_{ox})t_{eq}=(\kappa/3.9)t_{eq}.$$

Thus, materials with a dielectric constant greater than that of $SiO_2$, (typically about 3.9), will have a physical thickness that can be considerably larger than a desired $t_{eq}$, while providing the desired equivalent oxide thickness. For example, an alternate dielectric material with a dielectric constant of 10, such as $Al_2O_3$, could have a thickness of about 25.6 Å to provide a $t_{eq}$ of 10 Å, not including any depletion or inversion layer effects. Thus, a reduced equivalent oxide thickness for transistors can be realized by using dielectric materials with higher dielectric constants than $SiO_2$.

The thinner equivalent oxide thickness required for lower transistor operating voltages and smaller transistor dimensions may be realized by a significant number of materials, but additional fabricating requirements makes determining a suitable replacement for $SiO_2$ difficult. The current view for the future of the microelectronics industry still predicts silicon based devices. This requires that the gate dielectric employed be grown on a silicon substrate or silicon layer, which places significant constraints on the substitute dielectric material. During the formation of the dielectric on the silicon layer, there exists the possibility that a small layer of $SiO_2$ could be formed in addition to the desired dielectric. The result would effectively be a dielectric layer consisting of two sub-layers in parallel with each other and the silicon layer on which the dielectric is formed. In such a case, the resulting capacitance would be that of two dielectrics in series. As a result, the $t_{eq}$ of the dielectric layer would be the sum of the $SiO_2$ thickness and a multiplicative factor of the thickness, t, of the dielectric being formed, written as $$t_{eq}=t_{SiO_2}+(\kappa_{ox}/\kappa)t.$$

Thus, if a $SiO_2$ layer is formed in the process, the $t_{eq}$ is again limited by a $SiO_2$ layer. In the event that a barrier layer is formed between the silicon layer and the desired dielectric in which the barrier layer prevents the formation of a $SiO_2$ layer, the $t_{eq}$ would be limited by the layer with the lowest dielectric constant. However, whether a single dielectric layer with a high dielectric constant or a barrier layer with a higher dielectric constant than $SiO_2$ is employed, the layer directly in contact, or interfacing with the silicon layer must provide a high quality interface to maintain high channel carrier mobility.

One of the advantages of using $SiO_2$ as a gate dielectric has been that the formation of the $SiO_2$ layer results in an amorphous gate dielectric. Having an amorphous structure for a gate dielectric provides reduced leakage current problems associated with grain boundaries in polycrystalline gate dielectrics, which may cause high leakage paths. Additionally, grain size and orientation changes throughout a polycrystalline gate dielectric can cause variations in the film's dielectric constant, along with uniformity and surface topography problems. Typically, materials having the advantage of a high dielectric constant relative to $SiO_2$ also have the disadvantage of a crystalline form, at least in a bulk configuration. The best candidates for replacing $SiO_2$ as a gate dielectric are those with high dielectric constant, which can be fabricated as a thin layer with an amorphous form. Aluminum oxide alloyed with other oxides has been shown to raise the crystallization temperature of those oxides, and thus stabilize the long term interfacial characteristics of the amorphous dielectric.

Candidates to replace $SiO_2$ include high-κ dielectric materials. High-K materials include materials having a dielectric constant greater than silicon dioxide, for example, dielectrics materials having a dielectric constant greater than about twice the dielectric constant of silicon dioxide. An appropriate high-κ gate dielectric should have a large energy gap ($E_g$) and large energy barrier heights with the silicon substrate for both electrons and holes. Generally, the band gap is inversely related to the dielectric constant for a high-κ material, which lessens some advantages of the high-κ material. An example of a medium dielectric constant material (k=10) such as aluminum oxide, has a large bandgap of about 9 electron volts (eV). A set of high-κ dielectric candidates for replacing silicon oxide as the dielectric material in electronic components in integrated circuits includes the lanthanide oxides such as $Ce_2O_3$, $La_2O_3$, $Pr_2O_3$, $Nd_2O_3$, $Sm_2O_3$, $Gd_2O_3$, $Dy_2O_3$, $Tb_2O_3$, $Er_2O_3$, $Eu_2O_3$, $Lu_2O_3$, $Tm_2O_3$, $Ho_2O_3$, $Pm_2O_3$, and $Yb_2O_3$. Other candidates include various lanthanide silicates and zirconium oxide, $ZrO_2$. Such high dielectric constant layers provide a significantly thinner equivalent oxide thickness compared with a silicon oxide layer having the same physical thickness. Alternately, such dielectric layers provide a significantly thicker physical thickness than a silicon oxide layer having the same equivalent oxide thickness. This increased physical thickness aids in reducing leakage current.

Another consideration for selecting the material and method for forming a dielectric film for use in electronic devices and systems concerns the roughness of a dielectric film on a substrate. Surface roughness of the dielectric film has a significant effect on the electrical properties of the gate oxide, and the resulting operating characteristics of the transistor. The leakage current through a physical 1.0 nm gate dielectric may increase by a factor of 10 for every 0.1 increase in the root-mean-square (RMS) roughness of the dielectric layer.

During a conventional sputtering deposition process, particles of the material to be deposited bombard the surface at a high energy. When a particle hits the surface, some particles adhere, and other particles cause damage. High, energy impacts remove body region particles creating pits. The surface of such a deposited layer may have a rough contour due to the rough interface at the body region, and thus the electrical properties of a thin film may not be as good as the values in a bulk sample of the same material. Thus the method with which the thin film dielectric is deposited may have a substantial impact on the usefulness of the material in electronic devices.

In an embodiment, a dielectric film having a substantially smooth surface relative to other processing techniques is formed using atomic layer deposition (ALD). Such a dielectric layer can include a root mean square surface roughness less than one tenth of a thickness of the dielectric layer. Such a dielectric layer can include a root mean square surface roughness of less than 5 Angstroms. Further, forming such a dielectric film using atomic layer deposition can provide for controlling transitions between different material layers. As a result of such control, atomic layer deposited dielectric film may have an engineered transition with a substrate surface, or may be formed with many thin layers of different dielectric materials to enable selection of the dielectric constant to a value between that available from pure dielectric compounds.

ALD, which may be known as atomic layer epitaxy (ALE), is a modification of chemical vapor deposition (CVD) and may also be called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. In a pulse of a precursor gas, the precursor gas is made to flow into a specific area or region for a short period of time. Between the pulses, the reaction chamber is purged with a gas, which in many cases is an inert gas, and/or evacuated.

In the first reaction step of the ALD process the first precursor saturates and is chemisorbed at the substrate surface process, during the first pulsing phase. Subsequent pulsing with a purging gas removes excess precursor from the reaction chamber, specifically the precursor that has not been chemisorbed.

The second pulsing phase introduces a second precursor to the substrate where the growth reaction of the desired film takes place, with a reaction thickness that depends upon the amount of chemisorbed first precursor. Subsequent to the film growth reaction, reaction byproducts and precursor excess are purged from the reaction chamber. With a precursor chemistry where the precursors adsorb and react with each other on the substrate aggressively, one ALD cycle can be preformed in less than one second in properly designed flow type reaction chambers. Typically, precursor pulse times range from about 0.5 sec to about 2 to 3 seconds.

In ALD processes, the saturation of all the reaction and purging phases makes the film growth self-limiting. This self-limiting growth results in large area uniformity and conformality, which has important applications for such cases as planar substrates, deep trenches, and in the processing of porous silicon and high surface area silica and alumina powders. Significantly, ALD provides for controlling film thickness in a straightforward manner by controlling the number of growth cycles.

ALD was originally developed to manufacture luminescent and dielectric films needed in electroluminescent displays. Significant efforts have been made to apply ALD to the growth of doped zinc sulfide and alkaline earth metal sulfide films. Additionally, ALD has been studied for the growth of different epitaxial II-V and II-VI films, nonepitaxial crystalline or amorphous oxide and nitride films and multilayer structures of these. There also has been considerable interest towards the ALD growth of silicon and germanium films, but due to the difficult precursor chemistry, this has not been very successful.

The precursors used in an ALD process may be gaseous, liquid or solid. However, liquid or solid precursors should be volatile. The vapor pressure should be high enough for effective mass transportation. In addition, solid and some liquid precursors may need to be heated inside the reaction chamber and introduced through heated tubes to the substrates. The necessary vapor pressure should be reached at a temperature below the substrate temperature to avoid the condensation of the precursors on the substrate. Due to the self-limiting growth mechanisms of ALD, relatively low vapor pressure solid precursors can be used though evaporation rates may vary somewhat during the process because of changes in their surface area.

There are several other characteristics for precursors used in ALD. The precursors should be thermally stable at the substrate temperature because their decomposition would destroy the surface control and accordingly the advantages of the ALD method that relies on the reaction of the precursor at the substrate surface. A slight decomposition, if slow compared to the ALD growth, can be tolerated.

The precursors should chemisorb on, or react with the surface, though the interaction between the precursor and the surface as well as the mechanism for the adsorption is different for different precursors. The molecules at the substrate surface should react aggressively with the second precursor, which may be called a reactant, to form the desired solid film. Additionally, precursors should not react with the film to cause etching, and precursors should not dissolve in the film. The use of highly reactive precursors in ALD contrasts with the selection of precursors for conventional CVD type reactions.

The by-products in the reaction should be gaseous in order to allow their easy removal from the reaction chamber during a purge stage. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. The metal precursor reaction at the substrate is typically followed by an inert gas pulse (or purge) to remove excess precursor and by-products from the reaction chamber prior to an input pulse of the next precursor of the fabrication sequence.

By the use of RS-ALD processes, films can be layered in equal metered sequences that are all identical in chemical kinetics, deposition per cycle, composition, and thickness. RS-ALD sequences generally deposit less than a full layer of the material being deposited per cycle, for example $CeO_2$. Typically, a deposition rate of about 0.25 to about 2.00 Å per RS-ALD cycle can be realized.

The advantages of RS-ALD include continuity at an interface avoiding poorly defined nucleating regions that are typical for thin chemical vapor deposition (<20 Å) and physical vapor deposition (<50 Å), conformality over a variety of substrate topologies due to its layer-by-layer deposition technique, use of low temperature and mildly oxidizing processes, lack of dependence on the reaction chamber, growth thickness dependent solely on the number of cycles performed, and ability to engineer multilayer laminate films with resolution of one to two monolayers. RS-ALD processes allows for deposition control on the order of single monolayers and the ability to deposit monolayers of amorphous films.

A cycle of a deposition sequence includes pulsing a precursor material, pulsing a purging gas for the precursor, pulsing a reactant precursor, and pulsing the reactant's purging gas, resulting in a very consistent deposition thickness that depends upon the amount of the first precursor that absorbs onto, and saturates, the surface. This cycle may be repeated until the desired thickness is achieved in a single material dielectric layer, or may be alternated with pulsing a third precursor material, pulsing a purging gas for the third precursor, pulsing a fourth reactant precursor, and pulsing the fourth reactant's purging gas. In the case where the thickness of the first series of cycles results a dielectric layer that is only a few molecular layers thick, and the second series of cycles also results in a different dielectric layer that is only a few molecular layers thick, this may be known as a nanolayer material or a nanolaminate. A nanolaminate means a composite film of ultra thin layers of two or more different materials in a layered stack, where the layers are alternating layers of the different materials having a thickness on the order of a nanometer, and may be a continuous film only a single monolayer thick of the material. The nanolayers are not limited to alternating single layers of each material, but may include having several layers of one material alternating with a single layer of the other material, to obtain a desired ratio of the two or more materials. Such an arrangement may obtain a dielectric constant that is between the values of the two materials taken singly. The dielectric layer may be made of single layers of the two or more materials that are deposited individually, but may never the less be essentially a single film formed of an alloy between the two of more individual films. This may depend upon the particular materials being used and their physical and chemical properties relative to one another. If the materials are miscible the result is likely to be a single dielectric layer or alloy.

An embodiment of a method for forming an electronic device includes forming a dielectric layer by using an atomic layer deposition (ALD) technique to form a nanolaminate layered dielectric having alternating layers of cerium oxide ($CeO_2$) and aluminum oxide ($Al_2O_3$). The invention is not limited as to which layer is deposited first, and the resulting dielectric structure acts as a single dielectric layer. An embodiment of the structure is formed by depositing cerium oxide by atomic layer deposition onto a substrate surface using precursor chemicals containing cerium compounds, followed by a purge and deposition of an oxidizing material such as water vapor to form a thin (often a single molecular layer) film of $CeO_2$, then ALD depositing aluminum onto the substrate using precursor chemicals containing aluminum compounds, followed by a purge and deposition of an oxidizing material such as water vapor to form a thin (often a single molecular layer) film of $Al_2O_3$, and repeating as often as appropriate to form a thin laminate dielectric structure of the desired thickness. A dielectric layer formed of cerium oxide and aluminum oxide may be beneficially used in electronic devices because the high dielectric constant (high-k) of the film provides the functionality of a much thinner silicon dioxide film without the reliability loss consequent to using such physically thin films. Embodiments include structures for capacitors, transistors, memory devices, and electronic systems with dielectric layers containing an atomic layer deposited cerium oxide and aluminum oxide, and methods for forming such structures.

In an embodiment, a nanolaminate layer of cerium oxide and aluminum oxide is formed on a substrate mounted in a reaction chamber using RS-ALD in a repetitive sequence using precursor gases individually pulsed into the reaction chamber. An embodiment includes forming the cerium oxide using a metal alkoxy complex precursor gas such as 1, 10 phenanthroline tris 2, 2, 6, 6 tetramethyl heptanedonadionato cerium, ($Ce(thd)_3$ phen). An embodiment includes forming the aluminum oxide using a metal alkoxy complex precursor gas, such as trimethyl aluminum. Other solid or liquid precursors may be used in an appropriately designed reaction chamber. The use of such precursors in an RS-ALD reaction chamber may result in lower deposition temperatures in the range of 300 degrees Celsius or lower, and the ability to use mildly oxidizing reactant materials such as $H_2O$, $H_2O_2$, various alcohols, $N_2O$, ozone or oxygen. Purge gases may include nitrogen, helium, argon or neon.

FIG. 1 shows an embodiment of an atomic layer deposition system 100 for forming a nanolaminate dielectric film containing cerium oxide alternating with aluminum oxide. In FIG. 1, a substrate 108 on a heating element/wafer holder 106 is located inside a reaction chamber 102 of ALD system 100. The heating element 106 is thermally coupled to substrate 108 to control the substrate temperature. A gas-distribution fixture 110 introduces precursor, reactant and purge gases to the substrate 108 in a uniform fashion. The gases introduced by the gas distribution fixture, sometimes referred to a showerhead, react with the substrate 108, and any excess gas and reaction products are removed from chamber 102 by vacuum pump 104 through a control valve 105. Each gas originates from individual gas sources 114, 118, 122, 126, 130, and 134, with a flow rate and time controlled by mass-flow controllers 116, 120, 124, 128, 132 and 136, respectively. Gas sources 122 and 130 provide a precursor gas either by storing the precursor as a gas or by providing a location and apparatus for evaporating a solid or liquid material to form the selected precursor gas.

Also included in the system are purging gas sources 114 and 118, coupled to mass-flow controllers 116 and 120, respectively. The embodiment may use only one of the purge gases for all four disclosed illustrative purging steps, or both purge gases may be used simultaneously, or alternately as required for the particular desired result. Furthermore, additional purging gas sources can be constructed in ALD system 100, one purging gas source for each different precursor and reactant gas, for example. For a process that uses the same purging gas for multiple precursor gases less purging gas sources may be required for ALD system 100. The precursor, reactant and purge gas sources are coupled by their associated mass-flow controllers to a common gas line or conduit 112, which is coupled to the gas-distribution fixture 110 inside the reaction chamber 102. Gas conduit 112 may also be coupled to another vacuum pump, or exhaust pump, not shown, to remove excess precursor gases, purging gases, and by-product gases at the end of a purging sequence from the gas conduit 112.

Vacuum pump, or exhaust pump, 104 is coupled to chamber 102 by control valve 105, which may be a mass-flow valve, to remove excess precursor gases, purging gases, and by-product gases from reaction chamber 102 at the end of a purging sequence. For convenience, control displays, mounting apparatus, temperature sensing devices, substrate maneuvering apparatus, and necessary electrical connections as are known to those skilled in the art are not shown in FIG. 1. Though ALD system 100 is well suited for depositing $CeO_2$/$Al_2O_3$ films, other ALD systems commercially available may also be used.

The use, construction and fundamental operation of reaction chambers for deposition of films are understood by those of ordinary skill in the art of semiconductor fabrication. A variety of such reaction chambers may be used. Furthermore, one of ordinary skill in the art will comprehend the necessary detection, measurement, and control techniques in the art of semiconductor fabrication upon reading and understanding the disclosure.

The elements of ALD system 100 may be controlled by a computer. To focus on the use of ALD system 100, the computer is not shown. Those skilled in the art can appreciate that the individual elements such as pressure control, temperature control, and gas flow within ALD system 100 can be under computer control.

Figure 2:
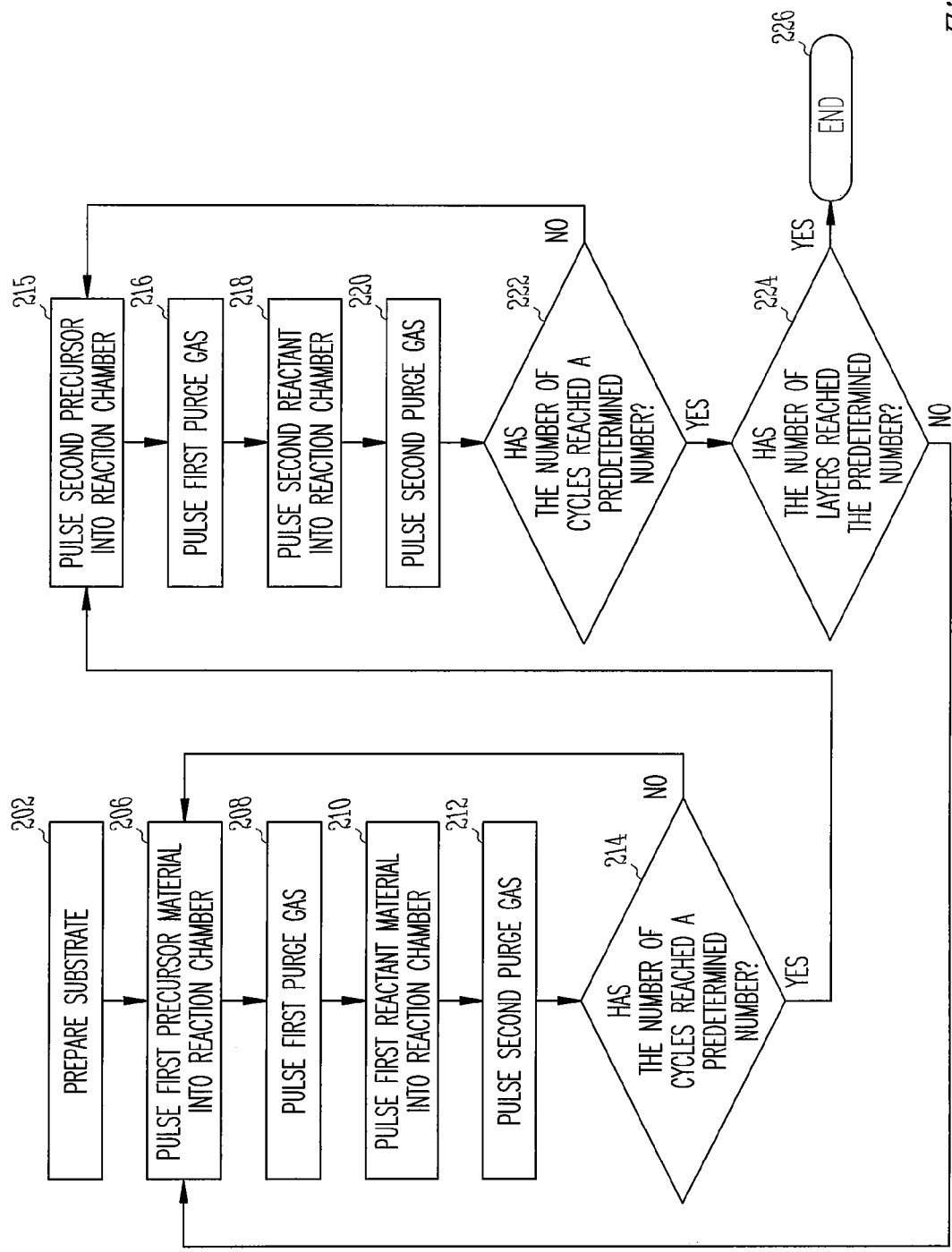
FIG. 2 illustrates a flow diagram of elements for an embodiment of a method to form a dielectric layer containing a nanolaminate layered sequence of cerium oxide ($CeO_2$) and aluminum oxide ($Al_2O_3$) by atomic layer deposition, according to various embodiments.

FIG. 2 illustrates a flow diagram of operational steps for an embodiment of a method to form a nanolaminate dielectric layer containing a cerium oxide alternating with aluminum oxide layer. At 202, a substrate is prepared to react immediately with, and chemisorb the first precursor gas. This preparation will remove contaminants such as thin organic films, dirt, and native oxide from the surface of the substrate, and may include a hydrofluoric acid rinse, or a sputter etch in the reaction chamber 102. At 206 a first precursor material enters the reaction chamber for a predetermined length of time, in an embodiment 0.5-2.0 seconds. An embodiment includes the first precursor material being a metal alkoxy complex precursor gas, but other cerium containing gases, liquids and sublimating solids may also be used. The first precursor material is chemically absorbed onto the surface of the substrate, the amount depending upon the temperature of the substrate, in one embodiment 300 degrees C., and the presence of sufficient flow of the precursor material. In addition, the pulsing of the precursor may use a pulsing period that provides uniform coverage of an absorbed monolayer on the substrate surface, or may use a pulsing period that provides partial formation of a monolayer on the substrate surface.

At 208 a first purge gas enters the reaction chamber for a predetermined length of time sufficient to remove substantially all of the non-chemisorbed first precursor material. Typical times may be 1.0-2.0 seconds with a purge gas comprising nitrogen, argon, neon, combinations thereof or other gases such as hydrogen. At 210 a first reactant gas enters the chamber for a predetermined length of time, sufficient to provide enough of the reactant to chemically combine with the amount of chemisorbed first precursor material on the surface of the substrate. Typical reactant materials include mildly oxidizing materials, including but not limited to water vapor, hydrogen peroxide, nitrogen oxides, ozone and oxygen gas, and combinations thereof. At 212 a second purge gas, which may be the same or different from the first purge gas, enters the chamber for a predetermined length of time, sufficient to remove substantially all non reacted materials and any reaction byproducts from the chamber.

At 214 a decision is made as to whether or not the thickness of the first dielectric material in the nanolaminate dielectric has reached the desired thickness, or whether another deposition cycle is required. If another deposition cycle is needed, then the operation returns to 206, until the desired first dielectric layer is completed, at which time the process moves on to the deposition of the second material at 215. At 215 a second precursor material enters the reaction chamber for a predetermined length of time, for example 0.5-2.0 seconds. An embodiment includes the first precursor material being a metal alkoxy complex precursor gas such as trimethyl aluminum, but other aluminum containing materials, in gas, liquid or sublimating solid form, may also be used. The second precursor material is chemically absorbed onto the surface of the substrate, in this case being the top surface of the first dielectric material, the amount of absorption depending upon the temperature of the substrate, in one embodiment 300 degrees C., and the presence of sufficient flow of the precursor material. In addition, the pulsing of the precursor may use a pulsing period that provides uniform coverage of an absorbed monolayer on the substrate surface, or may use a pulsing period that provides partial formation of a monolayer on the substrate surface.

At 216 the first purge gas is shown as entering the chamber, but the invention is not so limited. The purge gas used in the second dielectric material deposition may be the same or different from either of the two previously noted purge gases, and FIG. 1 could be shown as having more than the two purge gases shown. The purge cycle continues for a predetermined length of time sufficient to remove substantially all of the non-chemisorbed second precursor material.

At 218 a second reactant gas, which may the same or different from the first reactant gas, enters the chamber for a predetermined length of time, sufficient to provide enough of the reactant to chemically combine with the amount of chemisorbed second precursor material on the surface of the substrate. At 220 another purge gas enters the chamber, which may be the same or different from any of the three previously discussed purge gases, for a predetermined length of time, sufficient to remove substantially all non reacted materials and any reaction byproducts from the chamber.

At 222 a decision is made as to whether or not the thickness of the second dielectric material in the nanolaminate dielectric has reached the desired thickness, or whether another deposition cycle is required. If another deposition cycle is needed, then the operation returns to 214, until the desired second dielectric layer is completed. The desired thicknesses of the first and second dielectric materials in the nanolaminate dielectric may not be the same thickness, and there may be more deposition cycles for one dielectric material as compared to the other. For example, in one embodiment the number of cerium oxide layers is two for each one layer of aluminum oxide. If the second dielectric layer has reached the desired thickness the process moves on to a decision at 224 of whether the number of layers of the first and second dielectric materials has reached the desired number. In this illustrative embodiment, a single layer of the first dielectric and a single layer of the second dielectric have been completed at this point in the process. If more than a single layer of each dielectric material is desired the process moves back to another deposition of the first dielectric material at 206. After the number of interleaved layers of dielectrics one and two has reached the desired value, the deposition ends at 226. Although the present illustrative embodiment discusses and illustrates that the layers are distinct from each other, the individual layers are very thin and may act effectively as a single alloy layer.

The embodiments described herein provide a process for growing a dielectric film having a wide range of useful equivalent oxide thickness, $t_{eq}$, associated with a dielectric constant in the range from about 10 to about 30. This range of dielectric constants provides for a $t_{eq}$ ranging from about 13% to about 36% relative to a given silicon dioxide thickness. As compared to an acceptable physical silicon dioxide thickness, an embodiment for a cerium oxide may have a physical oxide thickness from three to eight times larger than the acceptable silicon dioxide thickness, providing reduced leakage current due to the thicker dielectric layer. Further, dielectric films of cerium oxide formed by atomic layer deposition can provide not only equivalent thin $t_{eq}$ films, but also films with relatively low leakage current. Additionally, the novel process can be implemented to form transistors, capacitors, memory devices, and other electronic systems including information handling devices. A method may further include forming metallization lines in a memory array and annealing the memory array in a $H_2$ ambient after forming the metallization lines. The present subject matter is not limited to two dielectric materials (that is, a binary dielectric), and the equipment described in FIG. 1 could have included a precursor and reactant 3, 4, which are not described for simplicity.

Figure 3:
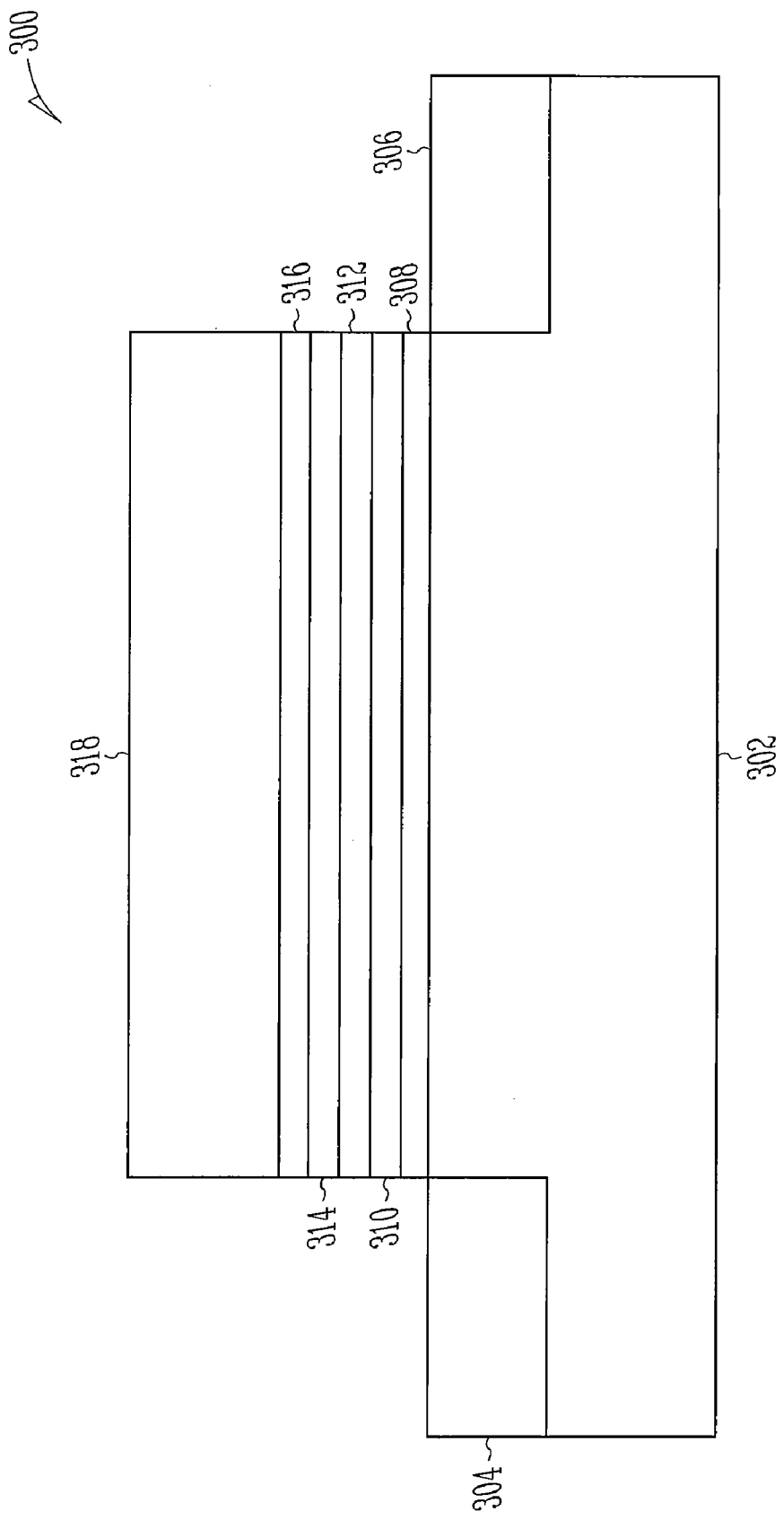
FIG. 3 illustrates an embodiment of a configuration of a transistor having a dielectric layer containing an atomic layer deposited nanolaminate layered sequence of cerium oxide ($CeO_2$) and aluminum oxide ($Al_2O_3$) dielectric layer.

FIG. 3 illustrates a single transistor in an embodiment of a method to form a dielectric layer containing an RS-ALD deposited cerium oxide/aluminum oxide gate oxide layer. This embodiment can be implemented with the atomic layer deposition system 100 of FIG. 1. A substrate 302 is prepared, typically a silicon or silicon containing material. In other embodiments, germanium, gallium arsenide, silicon-on-sapphire substrates, or other suitable substrates may also be used. This preparation process includes cleaning substrate 302 and forming various layers and regions of the substrate, such as drain diffusion 304 and source diffusion 306 of an illustrative metal oxide semiconductor (MOS) transistor 300, prior to forming a gate dielectric. The substrate is typically cleaned to provide an initial substrate depleted of its native oxide. The substrate may also be cleaned to provide a hydrogen-terminated surface. As an illustrative embodiment, a silicon substrate may undergo a final hydrofluoric (HF) rinse prior to ALD processing to provide the silicon substrate with a hydrogen-terminated surface without a native silicon oxide layer. Cleaning immediately preceding atomic layer deposition aids in reducing an occurrence of silicon oxide as an interface between silicon based substrate and dielectric formed using the atomic layer deposition process. The sequencing of the formation of the regions of the transistor being processed may follow typical sequencing that is generally performed in the fabrication of a MOS transistor as is well known to those skilled in the art.

The dielectric covering the area on the substrate 302 between the source and drain diffused regions 304 and 306 is deposited by RS-ALD in this illustrative embodiment, and comprises cerium oxide layers 308, 310, and 314, having interleaved aluminum oxide layers, 312 and 316. This alloy dielectric layer may be referred to as the gate oxide. In this illustrative embodiment the cerium oxide layer 308 is shown as being the first layer and in direct contact with the substrate 302; the present subject matter, however, is not so limited. There may be a diffusion barrier layer inserted between the first dielectric layer 308 and the substrate 302 to prevent metal contamination from affecting the electrical properties of the device. The described embodiment may also include having the first dielectric layer as aluminum oxide, since this affects the surface states and the work function of the dielectric layer. The illustrative embodiment also shows the different dielectric layers having the same thickness; however, the desired dielectric properties of the nanolaminate film may be best achieved by adjusting the ratio of the thickness of the two dielectric materials to different values. In an embodiment the ratio between the total thickness of cerium oxide layers 308, 310 and 314 is twice the total thickness of the aluminum oxide layers 312 and 316. A ratio of cerium oxide thickness to aluminum oxide thickness can include a 20% variation from an approximate 2 to 1 value. Even though the illustrative embodiment shows the cerium oxide layers as being distinct from the aluminum oxide layers, the gate oxide (layers 308 to 316) in total appears as a single alloyed dielectric layer. The transistor 300 has a conductive material forming a gate 318 in this illustrative embodiment, but the nanolaminate dielectric may also be used in a floating gate device such as an EEPROM transistor, as both the floating gate and the control gate oxide layers.

In an embodiment, the gate dielectric (layers 308-316) forms a tunnel gate insulator and a floating gate dielectric in a flash memory device. Use of dielectric layers containing a nanolaminate atomic layer deposited dielectric layer for a gate dielectric and/or floating gate dielectric in which the dielectric layer contacts a conductive layer is not limited to silicon based substrates, but may be used with a variety of semiconductor substrates.

Figure 4:
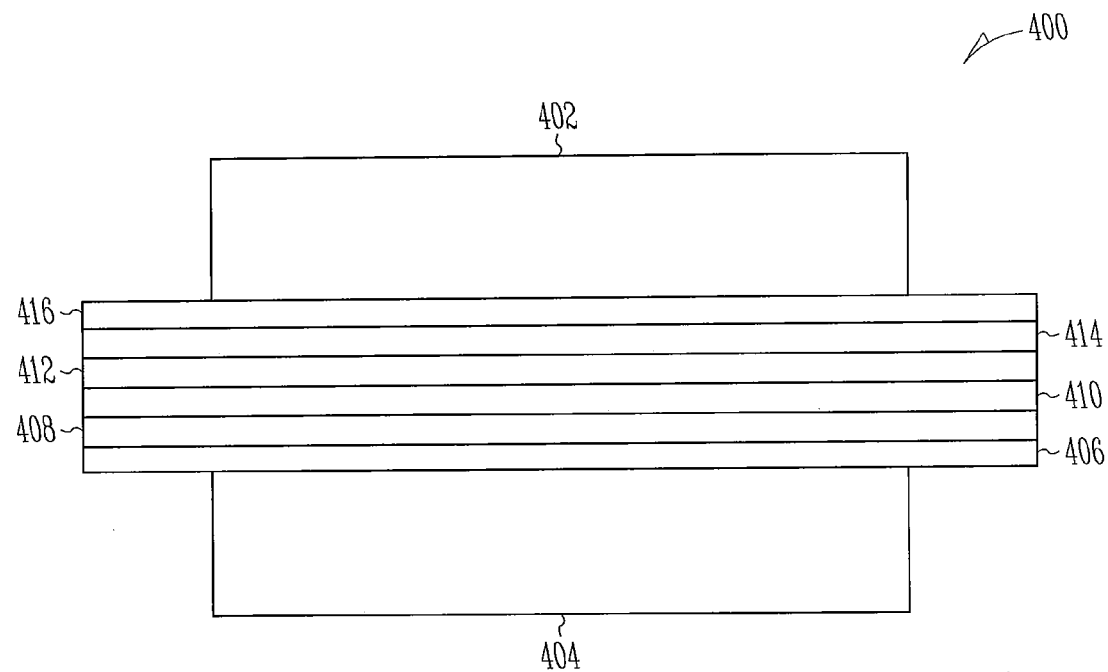
FIG. 4 shows an embodiment of a configuration of a capacitor having a dielectric layer containing an atomic layer deposited nanolaminate layered sequence of cerium oxide ($CeO_2$) and aluminum oxide ($Al_2O_3$) dielectric layer.

The described methods for forming dielectric layers containing a RS-ALD deposited dielectric layer which contacts a conductive layer may also be applied to forming capacitors in various integrated circuits, memory devices, and electronic systems. In an embodiment for forming a capacitor 400 illustrated in FIG. 4, a method includes forming a first conductive layer 402, a second conductive layer 404, and a nanolaminate dielectric having interleaved layers 406-416 of two or more different dielectric materials formed between the two conductive layers. The conductive layers 402 and 404 may be formed of metals, doped polysilicon, silicided metals, polycides, or conductive organic compounds. The sequencing of the layers depends on the application. The effective dielectric constant associated with a nanolaminate structure is attributable to N capacitors in series, where each capacitor has a thickness defined by the thickness of the corresponding layer. By selecting each thickness and the composition of each layer, a nanolaminate structure can be engineered to have a predetermined dielectric constant. Structures such as the nanolaminate structure shown in FIGS. 3 and 4 may be used in NROM flash memory devices as well as other integrated circuits. Transistors, capacitors, and other devices having dielectric films may be implemented into memory devices and electronic systems including information handling devices. Embodiments of these information handling devices may include wireless systems, telecommunication systems, computers and integrated circuits.

Figure 5:
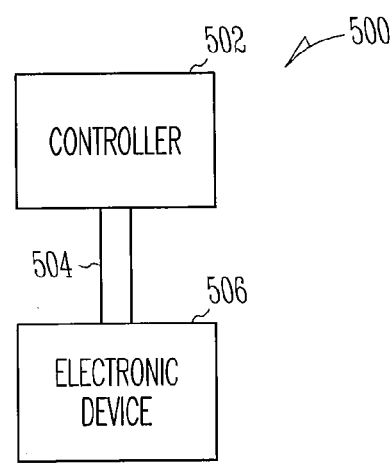
FIG. 5 is a simplified diagram for an embodiment of a controller coupled to an electronic device.

FIG. 5 illustrates a diagram for an electronic system 500 having one or more devices having a dielectric layer containing an atomic layer deposited oxide layer formed according to various embodiments. Electronic system 500 includes a controller 502, a bus 504, and an electronic device 506, where bus 504 provides electrical conductivity between controller 502 and electronic device 506. In various embodiments, controller 502 and/or electronic device 506 includes an embodiment for a dielectric layer containing a nanolaminate RS-ALD deposited oxide layer as previously discussed. Electronic system 500 may include, but is not limited to, information handling devices, wireless systems, telecommunication systems, fiber optic systems, electro-optic systems, and computers.

Figure 6:
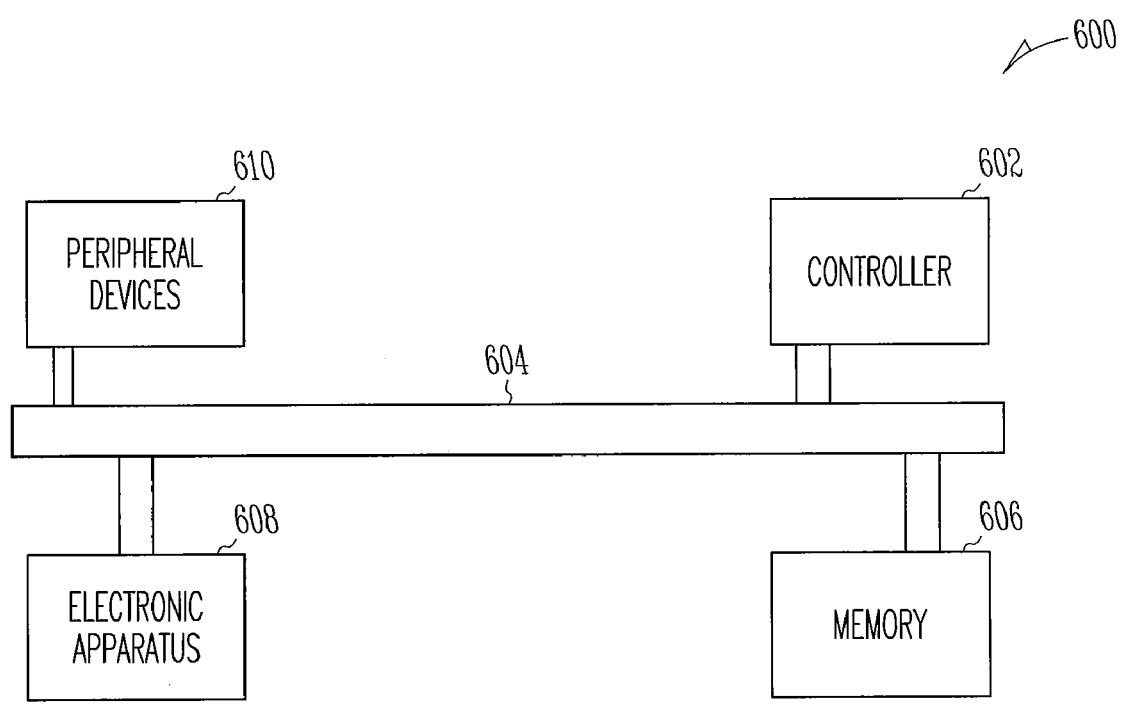
FIG. 6 illustrates a diagram for an embodiment of an electronic system having devices with a dielectric film containing an atomic layer deposited nanolaminate layered sequence of cerium oxide ($CeO_2$) and aluminum oxide ($Al_2O_3$) dielectric layer.

FIG. 6 depicts a diagram of an embodiment of a system 600 having a controller 602 and a memory 606. Controller 602 and/or memory 606 may include a dielectric layer having a nanolaminate RS-ALD dielectric layer. System 600 also may include an electronic apparatus 608, and a bus 604, where bus 604 may provide electrical conductivity and data transmission between controller 602 and electronic apparatus 608, and between controller 602 and memory 606. Bus 604 may include an address, a data bus, and a control bus, each independently configured. Bus 604 may also use common conductive lines for providing address, data, and/or control, the use of which may be regulated by controller 602. In an embodiment, electronic apparatus 608 may include additional memory devices configured similarly to memory 606. An embodiment may include an additional peripheral device or devices 610 coupled to bus 604. In an embodiment controller 602 is a processor. Any of controller 602, memory 606, bus 604, electronic apparatus 608, and peripheral device devices 610 may include a dielectric layer having a nanolaminate RS-ALD deposited oxide layer in accordance with the disclosed embodiments.

System 600 may include, but is not limited to, information handling devices, telecommunication systems, and computers. Peripheral devices 610 may include displays, additional storage memory, or other control devices that may operate in conjunction with controller 602 and/or memory 606. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies.

Formation of cerium oxide/aluminum oxide layers by a RS-ALD deposition may be realized using a trimethyl aluminum precursor and a cerium methyl alkoxy precursor. These dielectric films formed by RS-ALD and processed in relatively low temperatures, such as 300 degrees Celsius, may be amorphous and possess smooth surfaces. Such RS-ALD oxide films may provide enhanced electrical properties as compared to physical deposition methods, such as sputtering or typical chemical layer depositions, due to their smoother surface, and reduced damage, resulting in reduced leakage current. In particular the alloy of aluminum oxide improves the ability of cerium oxide films to remain in an amorphous state, and improves the thermal stability and interface properties of the resultant dielectric film. Amounts of aluminum oxide ranging from 10% to 45% of the total film composition are useful gate dielectrics.

Additionally, such dielectric layers have adjustable dielectric constants that are higher than the commonly used silicon dioxide and silicon nitride based dielectrics, and provide a significantly thicker physical thickness than a silicon oxide layer having the same equivalent oxide thickness, where the increased thickness may also reduce leakage current issues, and reduce oxide shorts due to pinholes and reduced thickness areas. These properties of layers containing cerium oxide/aluminum oxide films allow for application as dielectric layers in numerous electronic devices and systems.

Capacitors, transistors, higher level ICs or devices including memory devices, and electronic systems are constructed utilizing the novel process for forming a dielectric film having an ultra thin equivalent oxide thickness, $t_{eq}$. Gate dielectric layers or films containing atomic layer deposited lanthanide oxide are formed having a dielectric constant (κ) substantially higher than that of silicon oxide, such that these dielectric films are capable of a $t_{eq}$ thinner than $SiO_2$ gate dielectrics of the same physical thickness. Alternately, the high dielectric constant relative to silicon dioxide allows the use of much larger physical thickness of these high-κ dielectric materials for the same $t_{eq}$ of $SiO_2$. Forming the relatively larger thickness aids in processing gate dielectrics and other dielectric layers in electronic devices and systems.

Although specific embodiments have been illustrated and described herein, it will be appreciated by those of ordinary skill in the art that any arrangement that is calculated to achieve the same purpose may be substituted for the specific embodiments shown. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the embodiments of the present invention should be determined with reference to the appended claims, along with the full scope of equivalents to which such claims are entitled.

What is claimed is:

1. A method comprising:
    forming a memory array in a substrate including:
        forming a dielectric layer containing cerium oxide and aluminum oxide in an integrated circuit including forming the cerium oxide and aluminum oxide layers using an atomic layer deposition (ALD) process; and
        depositing a conductive layer contacting the dielectric layer; and
    forming an address decoder in the substrate, the address decoder coupled to the memory array.

2. The method of claim 1, wherein the method is a method of forming a flash memory device, and forming the dielectric layer includes forming the dielectric layer as an inter-gate insulator having the conductive layer as a gate of a transistor in the flash memory device.

3. The method of claim 1, wherein the method is a method of forming a memory device, including forming the conductive layer as an electrode of a capacitor and forming the dielectric layer as a dielectric of the capacitor in the memory device.

4. The method of claim 1, wherein the method further includes:
    forming metallization lines in the memory array; and
    annealing the memory array in a $H_2$ ambient after forming the metallization lines.

5. The method of claim 1, wherein depositing a conductive layer includes depositing by sputtering.

6. A method comprising:
    providing a controller;
    coupling an integrated circuit to the controller, wherein the integrated circuit includes a dielectric layer contacting a conductive layer, the dielectric comprising cerium oxide and aluminum oxide, wherein forming the dielectric layer contacting the conductive layer includes:
        forming the dielectric layer using an atomic layer deposition process; and
        depositing the conductive layer such that the conductive layer contacts the dielectric layer.

7. The method of claim 6, wherein coupling an integrated circuit to the controller includes coupling a memory device formed as the integrated circuit.

8. The method of claim 6, wherein providing a controller includes providing a processor.

9. The method of claim 6, wherein coupling an integrated circuit to the controller includes coupling a mixed signal integrated circuit formed as the integrated circuit having the dielectric layer contacting the conductive layer.

10. The method of claim 6, wherein the method is a method of forming an information handling system.

11. A method comprising:
   forming a memory array in a substrate including forming a dielectric layer containing cerium oxide and aluminum oxide in an integrated circuit as a gate insulator, the cerium oxide formed as a layer with a cerium oxide thickness and the aluminum formed as a layer with a aluminum oxide thickness such that a ratio of the cerium oxide thickness to the aluminum oxide thickness is within a 20% variation from a 2 to 1 value; and
   depositing a conductive layer contacting the dielectric layer as a gate of a transistor in the memory array.

12. A method comprising:
   forming a memory array in a substrate including forming a dielectric layer containing cerium oxide and aluminum oxide in an integrated circuit as a gate insulator; and
   depositing a conductive layer contacting the dielectric layer as a gate of a transistor in the memory array, further including forming the conductive layer as an electrode of a capacitor and forming the dielectric layer as a dielectric of the capacitor in the memory array, forming metallization lines in a portion of the conductive layer, and annealing the memory array in a $H_2$ ambient after forming the metallization lines.

13. The method of claim 11, wherein forming the dielectric layer includes forming an amorphous oxide having a formula of at least one of $Al_2O_3$ and $CeO_2$.

14. The method of claim 11, wherein the dielectric layer comprises a first plurality of cerium oxide layers having a selected thickness and a second plurality of aluminum oxide layers having a second selected thickness.

15. The method of claim 14, wherein a ratio of cerium oxide thickness to aluminum oxide thickness is approximately 2 to 1.

16. The method of claim 14, wherein a ratio of cerium oxide thickness to aluminum oxide thickness includes a 20% variation from an approximate 2 to 1 value.

17. The method of claim 11, wherein forming the dielectric layer containing cerium oxide and aluminum oxide includes an atomic layer deposition process.

18. A method comprising:
   forming a memory array in a substrate including forming a dielectric layer containing cerium oxide and aluminum oxide in an integrated circuit as a gate insulator, wherein forming the dielectric layer containing cerium oxide and aluminum oxide includes an atomic layer deposition process; and
   depositing a conductive layer contacting the dielectric layer as a gate of a transistor in the memory array, wherein forming the dielectric layer includes having at least two separate cerium oxide deposition steps and one separate aluminum oxide deposition step.

19. The method of claim 11, further including forming an address decoder in the substrate, the address decoder coupled to the memory array.

20. The method of claim 11, wherein forming the memory array includes forming a gate insulator on the substrate, forming a conductive floating gate electrode on the gate insulator, forming the dielectric layer containing cerium oxide and aluminum oxide as an intergate insulator on the conductive floating gate electrode, and forming a conductive control gate electrode on the intergate insulator.

21. The method of claim 11, wherein forming the memory array includes forming a flash memory.

22. A method comprising:
   forming a memory array in a substrate including forming a dielectric layer containing cerium oxide and aluminum oxide in an integrated circuit as a gate insulator; and
   depositing a conductive layer contacting the dielectric layer as a gate of a transistor in the memory array, wherein the dielectric layer includes a root mean square surface roughness less than one tenth of a thickness of the dielectric layer.

23. A method comprising:
   forming a memory array in a substrate including forming a dielectric layer containing cerium oxide and aluminum oxide in an integrated circuit as a gate insulator; and
   depositing a conductive layer contacting the dielectric layer as a gate of a transistor in the memory array, wherein forming the dielectric layer includes a root mean square surface roughness of less than 5 Angstroms peak to peak.

24. A method comprising:
   forming a memory array in a substrate including forming a dielectric layer containing cerium oxide and aluminum oxide in an integrated circuit as a gate insulator; and
   depositing a conductive layer contacting the dielectric layer as a gate of a transistor in the memory array, wherein the dielectric layer has a dielectric constant greater than 20.

25. The method of claim 11, wherein forming the dielectric layer includes forming a diffusion barrier layer disposed between the substrate and the dielectric layer.

* * * * *